US005746929A

United States Patent [19]
Schmidt et al.

[11] Patent Number: 5,746,929
[45] Date of Patent: May 5, 1998

[54] PROCESS FOR STRUCTURING POLYMER FILMS

[75] Inventors: Walter Schmidt, Zürich; Hermann Schmid, Vaterstetten, both of Switzerland

[73] Assignee: Dyconex Patente AG, Zug, Switzerland

[21] Appl. No.: 912,537

[22] Filed: Aug. 18, 1997

Related U.S. Application Data

[63] Continuation of Ser. No. 344,734, Nov. 23, 1994, abandoned.

[30] Foreign Application Priority Data

Nov. 23, 1993 [CH] Switzerland .............. 486/93

[51] Int. Cl.⁶ .............................................. C23F 1/00
[52] U.S. Cl. .............................................. 216/59; 216/69
[58] Field of Search .................... 216/59, 61, 69, 216/70; 156/345 CM

[56] References Cited

U.S. PATENT DOCUMENTS

| | | | |
|---|---|---|---|
| 4,209,356 | 6/1980 | Stein | 156/643 |
| 4,445,966 | 5/1984 | Carlson et al. | 156/643 |
| 4,931,135 | 6/1990 | Horiuchi et al. | 156/643 |
| 4,971,651 | 11/1990 | Watanabe et al. | 156/643 |
| 5,215,619 | 6/1993 | Cheng et al. | 156/345 |
| 5,372,673 | 12/1994 | Stager et al. | 156/626 |

FOREIGN PATENT DOCUMENTS

| | | |
|---|---|---|
| 0 129 199 | 12/1984 | European Pat. Off. |
| 42 32 998 | 4/1994 | Germany |
| WO85/04121 | 9/1985 | WIPO |

OTHER PUBLICATIONS

Tamagwa Norio et al, Device for Plasma Etching, Patent Abstracts of Japan, vol. 8, No. 111, May 24, 1984.
Fukuhara Keiji et al, Plasma Treatment System, Patent Abstracts of Japan, vol. 11, No. 133, Apr. 25, 1987.
Hayashi Hiroshi et al, Plasma Treating Apparatus, Patent Abstracts of Japan, vol. 12, No. 338, Sep. 12, 1988.
Yasuhiko Ogisu, Plasma Treatment Apparatus, Patent Abstracts of Japan, vol. 11, No. 242, Aug. 7, 1987.
Koshitou Asada, Equipment for Plasma Treatment, Patent Abstracts of Japan, vol. 11, No. 297, Sep. 25, 1987.

*Primary Examiner*—Kathryn L. Gorgos
*Assistant Examiner*—William T. Leader
*Attorney, Agent, or Firm*—Walter C. Farley

[57] ABSTRACT

A process for structuring polymer films, such as printed circuit boards and film boards, uses a plasma, which is formed in a container by the excitation of gas mixtures by microwaves, in which there is a control of the surface temperature of the polymer films during structuring by the plasma. By adjusting the parameters it is possible to operate just below a material-damaging temperature limit for polymer films, so that structures or microshapes are carefully plasma-eroded in polymer films. At high surface temperatures and with a dense plasma, structures or microshapes are rapidly eroded by the plasma, in which the structures or microshapes are homogeneously plasma-eroded with a uniform distribution of the surface temperature and gas flow. The surface temperature is maintained below the material-damaging temperature by controlling the power density of the microwave energy, the level of energy provided to a heater in the container, and the pressure of gas in the container in accordance with a time pattern algorithm using a computer.

15 Claims, 4 Drawing Sheets

5,746,929

PROCESS FOR STRUCTURING POLYMER FILMS

This application is a continuation of Ser. No. 08/344,734, filed on Nov. 23, 1994, now abandoned.

The invention is in the field of processing technology under plasma action and relates to a process for structuring e.g. insulating layers in printed circuit boards and film circuit boards or polymer films.

BACKGROUND OF THE INVENTION

Nowadays films made from polymer materials are used in numerous technical fields. One such field making particularly high demands with respect to the miniaturization of functions, structures, weight and thickness of said films is printed circuit board technology. Printed circuit boards are single-layer or multilayer printed circuits comprising a combination of flat current paths, blind holes and interfacial connections (connections of different layers of printed circuits) and insulating layers. In film circuit boards current paths are often structured in thin, electrically conductive foils or films and electrically insulating films are used as insulating layers or dielectrics.

A known, economic and universally usable production method for small structures in polymer films is plasma etching. Plasma etching has the advantage that a large number of holes or hole structures can be simultaneously produced on large surface areas.

As prior art, reference is made to the process for the plasma etching of insulating films described in U.S. Pat. No. 4,720,322. Use is made of a plate reactor, which is equipped with pairs of parallel, plate-like electrodes and which excites a gas mixture by means of a.c. voltages in the range 40 kHz to 13.56 MHz (preferably 100 kHz) to a plasma. The reactor can be evacuated and for producing the plasma a mixture of oxygen ($O_2$) and carbon tetrafluoride ($CF_4$) is excited under vacuum by an electric a.c. field with frequencies in the range 40 kHz to 13.56 MHz. The ions formed in the plasma are accelerated towards the etching material by a superimposed, electric accelerating voltage, where they produce blind holes. In a specific example adopting this procedure 50 to 100 µm deep blind holes are produced after etching for 4 hours in epoxy-aramide material.

European patent 144,943 describes another process for the plasma etching of polyimide films, which also uses a plate reactor and which aims at a particularly high underetching or undercutting of the etching material. The etching material consists of polyimide films copper clad on both sides (in each case 35 µm copper, 25 µm acrylic adhesive and polyimide, Du Pont LF9111). Through-etching of these films takes place in accordance with masks in the form of openings in the copper coatings at frequencies of 13.56 MHz over a period of 70 minutes.

A disadvantage of the aforementioned prior art is its low etching rate. Admittedly small structures can be simultaneously produced, but this takes a long time. In addition, the thin films to be etched have a very limited thermal capacity and are consequently very rapidly heated during etching. To avoid overheating and therefore a destruction of the films, the coupled-in power must be kept low, but this leads to a reduction in the plasma density and further reduces the etching rate.

Another disadvantage of the cited prior art is the low uniformity of the etching rate in such plate reactors, i.e. the holes are etched through faster in the central areas than in the marginal areas. In order to be able to reliably etch through all the holes of a film, the holes in the central areas of the films are over-etched. This limited uniformity is reinforced by the fact that the etching material is not homogeneously heated, which is in particular always the case if the film to be etched has to be brought into thermal contact with other components, such as plate electrodes or holders.

It would be desirable to further extend and refine the variety of structures in polymer films, e.g. in insulating layers of printed circuit boards and film circuit boards and to make such structures rapidly, uniformly and in material-protecting manner.

SUMMARY OF THE INVENTION

An object of the present invention is to provide a process for structuring polymer films, which permits a rapid, homogeneous and material-protecting production of such structures.

The invention provides a process, which is carried out in a plasma reactor with numerous process parameter control possibilities. This control permits an optimization of the most important process parameters. The process is optimized as a function of the surface temperature of polymer films, such as e.g. printed circuit boards and film circuit boards. Structures are plasma-eroded at temperatures below a critical, material-damaging limiting temperature with respect to the polymer films. In order to achieve a high removal rate, the structures are made at very high temperatures and with a very high plasma density. In addition, a very uniform temperature distribution on the surface of the polymer films and a very homogeneous gas flow, together with a movement of the polymer films in the plasma performed during structuring, lead to a uniform, high erosion rate over the entire surface extension thereof.

Thus, according to the invention, the surface temperature of the polymer film and its distribution is measured using, e.g., pyrometers and the process parameters of the plasma reactor are then optimized in such a way that working occurs at surface temperatures just below a critical temperature and with a very dense plasma. A very dense plasma is obtained in the case of optimum, homogeneous gas mixtures in a specific flow and pressure range, with high power densities of a microwave transmitter and at high excitation frequencies.

Thus, due to the critical, material damaging limiting temperature, the temperature of the polymer films is a dominant process parameter. However, it is also important from other respects. In this connection it is less the chemical reaction on the surface of the material to be removed, which is naturally also dependent on the temperature, than the desorption rate of the reaction products, which very rapidly rises with the temperature. With rising temperature the reaction kinetics can be better arranged, so that high erosion rates are obtained. Advantageously the surface temperature is chosen in such a way that on the one hand there is no thermal damage or destruction with respect to the polymer films and on the other a high erosion rate is obtained. This optimum limiting temperature varies for the different plastics materials used for the production of polymer films. Finally, it is also possible to optimize the temperature pattern. Thin polymer films with a very low thermal capacity are rapidly heated to high temperatures during structuring, whereas e.g. thicker printed circuit boards which have a high copper percentage, only heat slowly during structuring and therefore require a longer erosion.

It is known that the plasma density for a given microwave power increases with rising excitation frequency until all the particles are ionized and pass into a saturation state. This saturation level is dependent on the gas pressure present. With high gas pressures of approximately 1 hPa the free path length of the particles is so small that on the one hand the acceleration of the ionized particles in the electric a.c. field, caused by the high impact probability at high pressures, is very small, but on the other hand the recombination probability also rises and consequently the plasma density falls. At low pressures below 0.1 hPa the free path length of the particles is sufficiently high to obtain an adequately high acceleration without any interfering intermediate impacts and also the recombination probability is much lower. However, the availability of particles to be ionized is greatly reduced, so that with pressures of 0.1 hPa and lower the plasma density falls again. In the intermediate range of said parameter field there is a zone of optimum high plasma density with high erosion rate and optimum shielding of the electric high frequency field, so that the polymer films are rapidly plasma-eroded and protected against overheating.

Another important process parameter is the gas flow, i.e. the availability of new reactive particles per time unit. When the gas flow is too low, the reactive particles of the plasma are rapidly consumed and the plasma is enriched with reaction products, so that the plasma density and therefore the erosion rate drop. This high concentration of reaction products in the plasma even leads to the redeposition thereof on the polymer films, which naturally causes a drop in the erosion rate. With a too high gas flow the residence time of the reactive particles in the chamber is too short for effective erosion, which once again leads to a reduction in the erosion rate. Thus, with regards to the gas pressure and gas flow an optimum parameter range can be obtained where, apart from an optimum high erosion rate, there is a careful structuring of the polymer films without any overheating.

The microwave frequency is another process parameter. According to the invention, microwave excitation takes place in the GHz frequency range, which has the advantage of high plasma densities and shielding action of the plasma compared with microwave radiation. At frequencies of 2.45 GHz the microwave energy is better absorbed by the gas mixture and consequently only a small part is coupled into the polymer films, so that the temperature thereof cannot rise to supercritical values. For plasma excitation purposes it is naturally also possible to use microwaves with a frequency lower than 2.45 GHz, e.g. frequencies in the kHz or MHz range. However, then the plasma is less dense and consequently the erosion rate is much lower and the shielding action of the plasma relative to microwave radiation is reduced, so that microwave radiation is increasingly absorbed on the polymer films and leads to the overheating thereof.

In the invention microwaves are produced by magnetrons as microwave transmitters with a frequency of 2.45 GHz, which is approximately two orders of magnitude above those of known processes. With gas pressures of 0.1 to 1 hPa and gas flows of a few 100 ml/min, during the structuring of polymer films erosion rates of 2 to 3 μm/min are obtained, which represents an acceleration by a factor of 3 to 4 compared with known processes. The speed gain makes it possible to produce complicated structures in relatively short times of 10 to 20 minutes. The most varied plastics materials can be structured, the above-mentioned, fundamental considerations applying to all these materials. The absolute level of the erosion rate is naturally dependent on the type of material, its chemical structure and degree of crosslinking. This novel process is called plasma erosion and the numerous differently shaped structures are called microshapes.

This process is fully usable for the production of printed circuit boards and film circuit boards and is compatible with known, proven circuit board technology methods.

BRIEF DESCRIPTION OF THE DRAWINGS

The process according to the invention for the production of microshapes in polymer films is described in greater detail hereinafter with reference to the following figures wherein.

DESCRIPTION OF THE PREFERRED EMBODIMENTS

Figure 1:
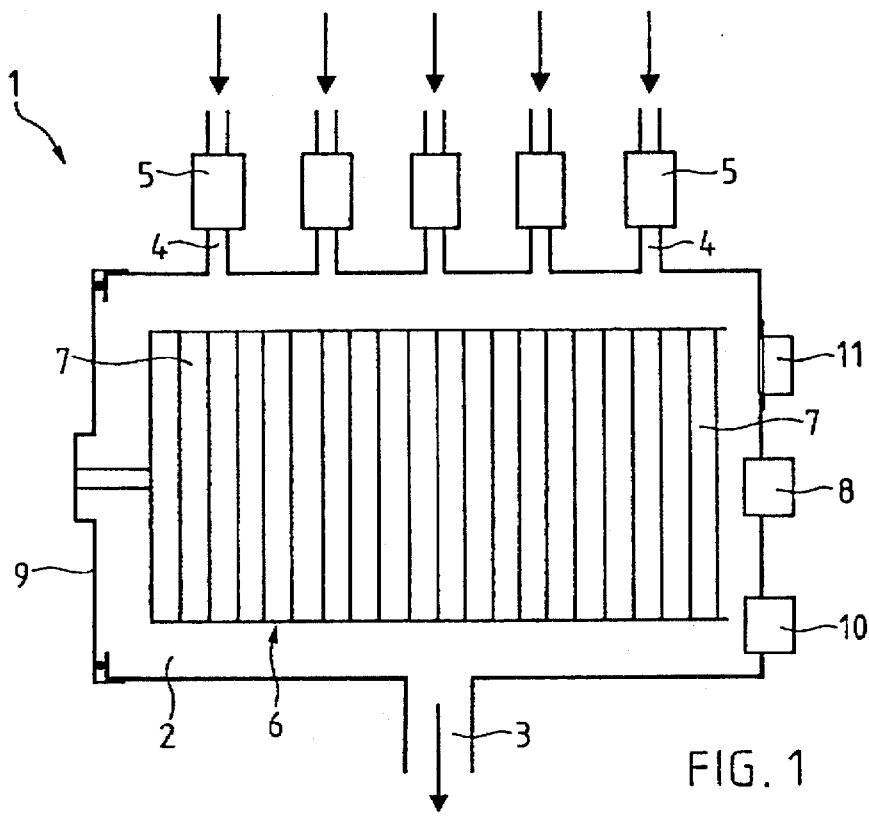
FIG. 1 is a schematic diagram of part of a first embodiment of a plasma reactor for the process according to the invention.

FIG. 1 schematically shows the structure of part of a first embodiment of a plasma reactor for the process according to the invention. Its chamber or container 2 can be evacuated by means of one or more suction connections 3 and pumps (see the arrows). Gas mixtures can be introduced in regulated manner by means of inlet connections 4 and flow regulators 5 (see the arrows). Advantageously the gas flows are in the range 50 to 2000 ml/min. The chamber pressure is measured by means of one or more pressure recorders 10. Advantageously the operating pressure is between 0.1 and 1 hPa. For plasma erosion use is made of gas mixtures consisting of gases such as $O_2$, $CF_4$, $SF_6$ and $C_2F_6$, which have proved satisfactory in plasma etching. Advantageous gas mixtures have an $O_2$ excess with approximately 3 to 25% $CF_4$. The optimum $CF_4$ proportion is in the range 6 to 16%. The container 2 can be opened by a door 9 closable in vacuum-tight manner, so as to bring the polymer films to a loading basket 6, e.g. by clamping. Naturally operation is also possible where the container 2 does not have to be opened for loading purposes. Thus, it is also possible to continuously process polymer films 7 from a reel, being led continuously into the containers 2 via tight passages and traverse the same guided on guidance means See, for example, U.S. Ser. No. 08/556,921, commonly owned. The microwave transmitter 8, e.g. a magnetron, emits microwaves with a fixed, high excitation frequency of 2.45 GHz. As can be gathered from the prior art, excitations are naturally also possible with lower frequencies of 13.56 MHz. However, with a view to obtaining rapid structuring high excitation frequencies above 13.56 MHz are preferred. The number of possible microwave frequencies is legally limited, so that it is appropriate to use 2.45 GHz. The power density is adjustable and for rapid plasma erosion is more than 10 Watt/liter. The temperature and temperature distribution can be locally determined by means of a pyrometer 11. For insulating layers such as polyimide films the surface temperature should not exceed 200° C.

In the plasma erosion process according to the invention it is advantageous to proceed in such a way that the polymer films 7 are brought into the loading basket 6, the container 2 is evacuated to a basic pressure below the operating pressure, a gas mixture is introduced into the containers 2, the gas flow and chamber pressure are stabilized, the microwave transmitter 8 is then switched on and the transmitting power adjusted, so that a plasma is ignited in the gas mixture. Everywhere in the container 2 the plasma can be excited by microwaves. Due to the fact that gas mixtures are introduced and pumped out continuously, the reactive particles of the plasma strike the insulating layers and erode the same to microshapes. The erosion rate is kept high and homogeneous by temperature control. At the end of this structuring, e.g. at the end of a specific erosion time, the microwave transmitter 8 is switched off, the gas supply stopped and the container 2 ventilated in order to remove the polymer films.

Thus, the most important plasma erosion process parameters are the gas pressure, gas flow, polymer film surface temperature, gas type and gas mixture composition and finally the microwave transmitter power. All these parameters are measurable and regulatable, can be controlled by a computer and the plasma reactor 1 can consequently be controlled in a fully automatic manner. Such a control also leads to an optimization of the process parameters or a determination of optimum parameter sets. In the process according to the invention the parameters are optimized with respect to the surface temperature. The surface temperature is controlled during the structuring by the plasma and by a corresponding parameter setting is kept just below the material-damaging limiting temperature for polymer films, so as to carefully erode microshapes.

Figure 2:
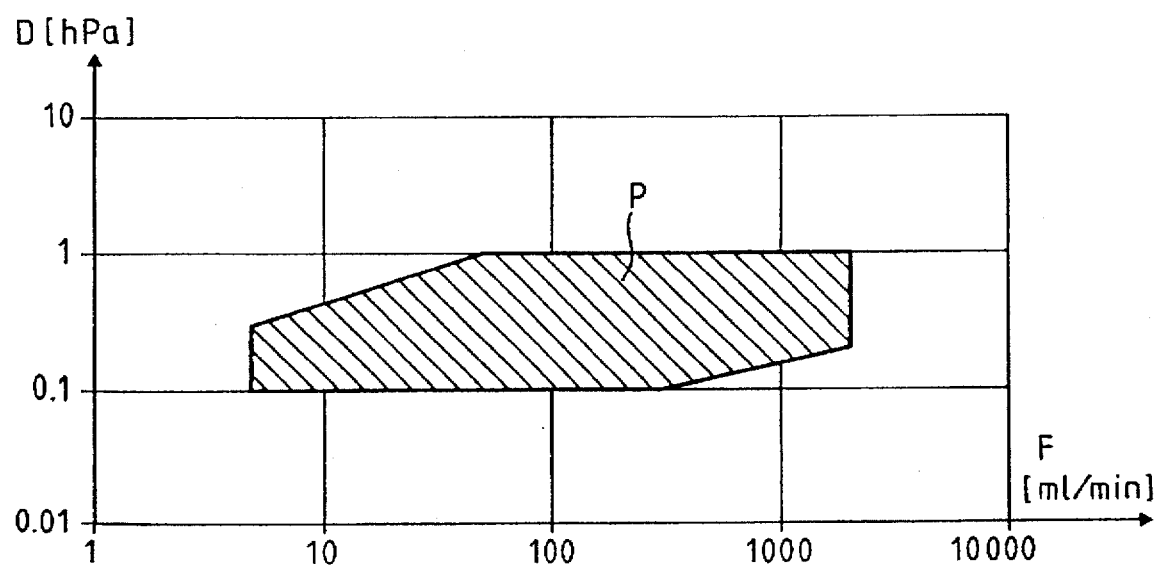
FIG. 2 is a density-flow rate graph of a parameter field with optimized parameters and high erosion rates.

FIG. 2 shows such an optimization of the process parameters and in a diagram is shown a zone of high erosion rates on an insulating layer as a function of the parameters gas flow F in ml/min and gas pressure D in hPa. The other parameters such as the surface temperature, gas mixture composition and microwave power are kept constant in optimum manner. A rapid plasma erosion requires a dense plasma with a very high surface temperature, the existence range of such a dense plasma being determinable in a parameter field P on the basis of apparatus and physical boundary conditions with respect to the gas flow F and the gas pressure D. These boundary conditions are maximum gas flows and pressures and minimum gas flows and pressures. For gas flows F smaller than 50 ml/min there is a marked drop in the erosion rate, because insufficient reactive particles of the plasma are present in the container 2. However, with gas flows F higher than 2000 ml/min the residence time of the reactive particles in the container 2 is too short (it is necessary to pump out more strongly in order to maintain the gas pressure D), so that the erosion rate drops sharply. For gas pressures D below 0.1 hPa the heat transfer by non-absorbed microwaves in the insulating layers is so high that they can be destroyed by overheating. For gas pressures D higher than 1hPa the recombination probability of the ions and radicals in the plasma is so high that the erosion rate drops drastically. The parameter field P defines an optimum range, which only differs slightly with variable microwave power. Thus, by microwave power control it is possible to set an optimum high surface temperature, without having to change the other parameters.

Figure 3:
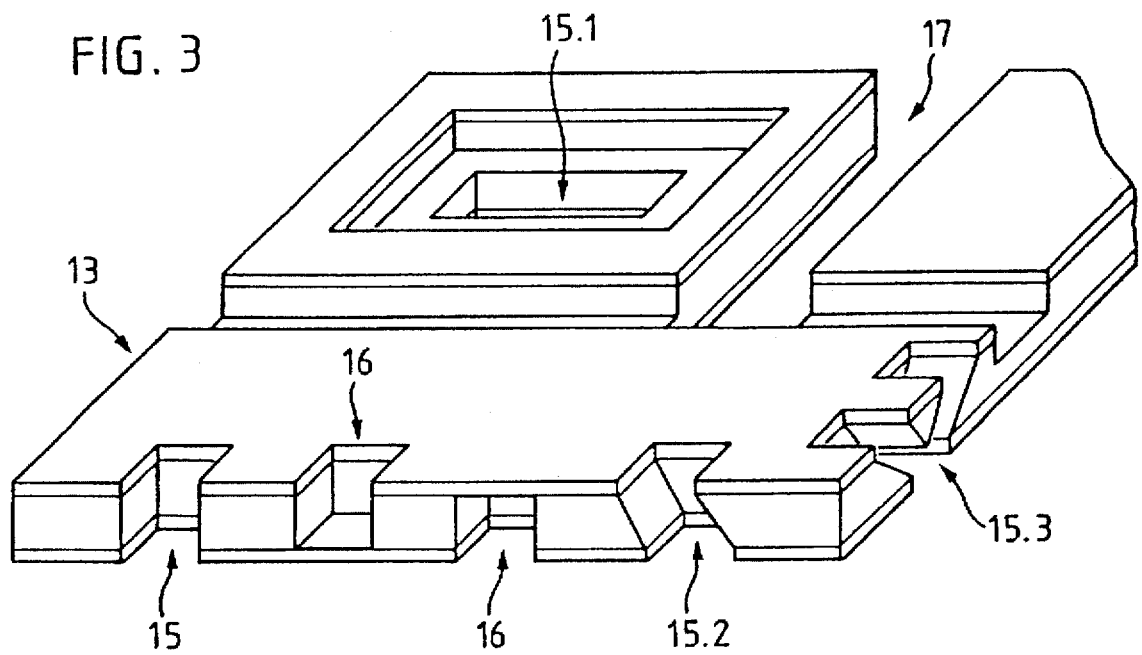
FIG. 3 is a perspective view of a three-layer film circuit board having microshapes in polymer films produced according to the process of the invention.

FIG. 3 shows microshapes in polymer films produced by the process according to the invention in a three-layer film circuit board. The latter comprises a 50 μm thick polyimide film 13 on both sides of which are laminated thin copper foils and having a surface area of 250×250 $mm^2$ as an insulating layer. Such a process for making small holes in such film circuit boards has been described in U.S. Pat. No. 5,436,062 by the same inventor. In preceding working stages, e.g. by wet chemical etching, 5% of the copper foil faces have been exposed down to the polyimide film 14 and form a mask for a plasma erosion. A typical gas mixture for plasma erosion consisting of 92% $O_2$ and 8% $CF_4$ is excited to a plasma at a gas flow of 500 ml/min and a gas pressure of 0.4hPa, by 2.45 GHz microwaves and a power density of 18 Watt/liter, the film circuit board surface temperature being below 200° C. Thus, within 23 minutes through-holes 15 are eroded in the polyimide film, i.e. at an erosion rate of 2.2 μm/min. It is also possible to structure numerous other and in part complicated microshapes. Thus, apart from the through-holes 15, it is possible to shape single sloping through-holes 15.2, double-sloping through-holes 15.3, through windows 15.1, blind holes 16 and through grooves 17.

The erosion rate of 2.2 μm/min is at least a factor 3 higher than the etching rates of the plasma etching processes described in U.S. Pat. No. 4,720,322 and European patent 144,943. In order to be able to compare the rates of the different eroded and etched materials of these processes, material-specific conversions were made. Thus, the epoxy-aramide material of the US patent can be etched roughly 30% faster than polyimide giving a polyimide-related rate of approximately 0.13 to 0.26 μm/min. The copper-clad polyimide films (Du Pont LF9111) of the European patent has acrylic adhesives which can be etched 300% faster, so that here there is a polyimide-related rate of 0.5 to 0.6 μm/min.

Figure 4:
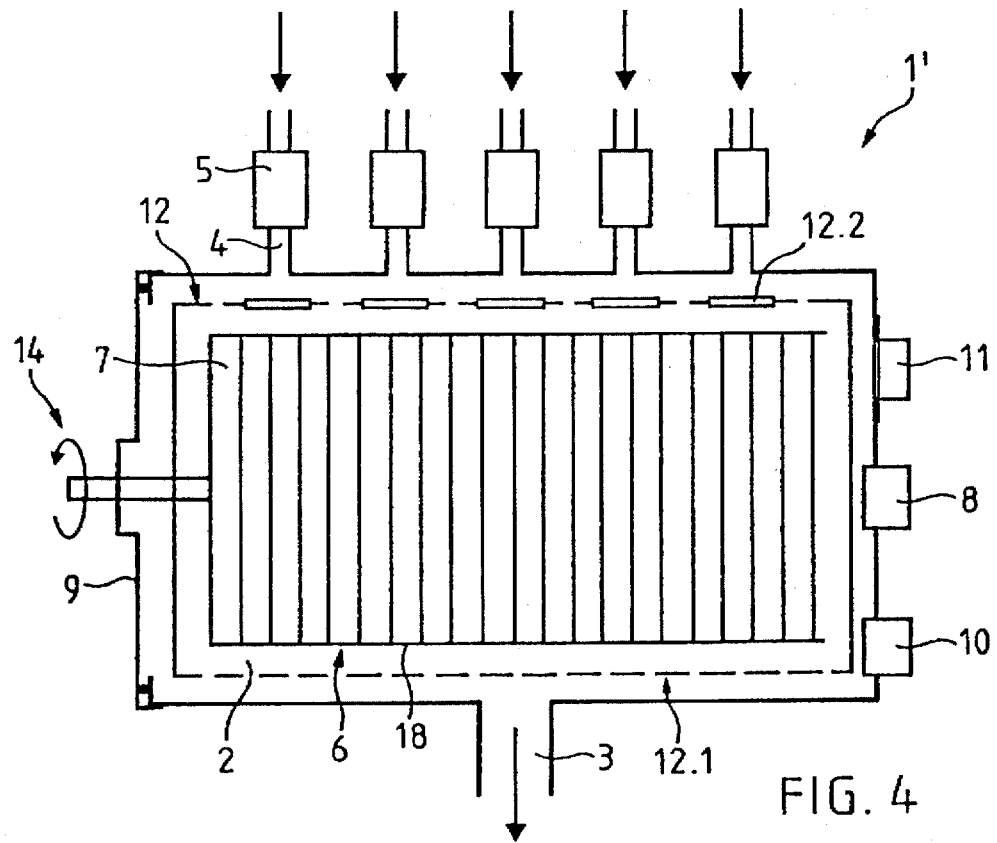
FIG. 4 is a schematic diagram of part of a second embodiment of a plasma reactor for the process according to the invention.

FIG. 4 schematically shows the structure of part of a second embodiment of a plasma reactor for the process according to the invention. This plasma reactor 1' is substantially identical to that according to FIG. 1, so that hereinafter only the additions provided by the second embodiment will be described. They relate to obtaining very uniform surface temperature and gas flow distributions. The arrangements and movements of the polymer films in the containers are as uniform as possible, so as in this way to be able to erode homogeneous microshapes.

The temperature control concept is broadened and intensified. It is no longer a question of reaching high temperatures for rapid plasma erosion, but instead very uniform temperature profiles are produced on the polymer films 7. For this purpose the plasma reactor 1' contains further devices such as a heater 12, baffle plates 12.2 and distributor plates 12.1, as well as a rotary loading basket 6 with special clamping or fixing devices.

The heater 12 is used for minimizing heat emission in the direction of cold chamber areas, particularly in the direction of the inner walls of the chamber 2. In this way the chamber walls are heated to a temperature which is as close as possible to the critical temperature. This heating can take place in that the plasma reactor 1' is placed in an oven, or in that the outer walls of the container 2 are heated by means of strip heaters, or in that the inner walls of the container 2 are heated by means of a heater 12. The heater 12 can be made from a metal such as aluminium and polished in order to obtain as emission protection an optimum homogeneous distribution of the heat emission in the container. The heater 12 can also be passively worked and consists solely of small, thin aluminium plates, which shield the cold chamber areas against the polymer films. Thus, during plasma erosion, it can be heated rapidly by trapping microwave beams or by contact with hot particles and can consequently prevent an excessive temperature gradient between the polymer films and the chamber walls.

The gas flow distribution is also an important factor. Thus, the erosion rate is significantly dependent on the availability of reactive particles in the plasma. It is also highly dependent on how rapidly the reaction products are removed. Thus, importance is attached to the arrangement and construction of the gas inlets, the construction of the pumping-out openings and the arrangement of the polymer films 7 with respect to the flow directions of the gas mixture in the plasma reactor 1'. p Advantageously the gas mixture is mixed upstream of the inlet and uniformly introduced by means of inlet connections 4 distributed uniformly over the walls of the container 2. The aim of the inlet means is to provide an equal quantity of reactive particles per time unit over the polymer films. To carry this out in an optimum manner, corrections are made by means of adjustable nozzles, e.g. through the flow regulators 5, so that different gas mixture quantities pass through different openings to different points of the container, so as in this way to produce an optimum, homogeneous gas mixture in the entire erosion zone on the polymer films 7 to be eroded. The inlet nozzles suffer from the disadvantage that in the container 2 frequently lobar gas flows occur, which is prejudicial to an optimum gas propagation. This disadvantage is obviated by fitting baffle plates 12.2. The baffle plates 12.2 are e.g. integrated into the heater 12 provided with openings and installed at the outlet of the inlet connections 4, so that the gas mixture flowing out of the same is whirled up thereon.

In the same way as the nature of the gas inlets, the position and arrangement of the pumping-out openings are critical. The suction connection 3 projecting into the container 2 leads to a local, excess suction action there, which must be avoided. Advantageously, for this purpose a distributor plate 12.1 in the form of an aluminium plate having holes is fitted above the suction connection 3, so that after flowing through the container the gas mixture is homogeneously sucked off through these holes. In the embodiment according to FIG. 4 the distributor plate 12.1 is integrated into the heater 12. A homogeneous sucking off can e.g. be brought about by holes arranged with varying density and size on the distributor plate 12.1, so that with increasing distance from the suction connection 3 the holes become larger and denser, so as in this way to compensate for the decreasing suction power.

A further homogenization of the temperature distribution is brought about by rotating the polymer films 7 in the container. It has proved advantageous for the polymer films 7 to be eroded to be loaded parallel to the gas flow direction and to be rotated in this orientation with respect to the gas flow by means of a drive 14 about the longitudinal axis of the loading basket 6. In this orientation parallel to the gas flow the gas mixture flows longitudinally around the surfaces to be eroded. Within the largely closed heater 12 a directed flow is consequently formed with a limited, or minimum resistance and extends from the baffle walls 12.2 to the distributor plates 12.1. This flow can be varied by the spacing of the polymer films 7 in the loading basket 6. Advantageously the polymer films 7 are not too closely juxtaposed and their spacings should not be below 10 mm. A spacing of 20 mm is optimum for the gas flows and pressures. If the polymer films 7 are too far apart, then there is a decrease in the filling level and throughput of the plasma reactor 1'.

Finally, the temperature distribution is optimized through the manner of clamping or fixing the polymer films 7 in the loading baskets 6. In order to avoid the occurrence of heat flows by direct contact between bodies at different temperatures, the fastenings for the polymer films 7 are made from particularly poor heat conducting materials and the contact points of said fastenings 18 are made particularly small. Advantageously the polymer films 7 are fixed by means of high-grade steel spring clips with pointed clipping faces in the loading baskets 6.

Taking account of all the above measures a plasma erosion inhomogeneity of below ±5% can be obtained. This should be compared with conventional plasma reactors such as plate reactors, where inhomogeneities of 30% have to be accepted.

Figure 5:
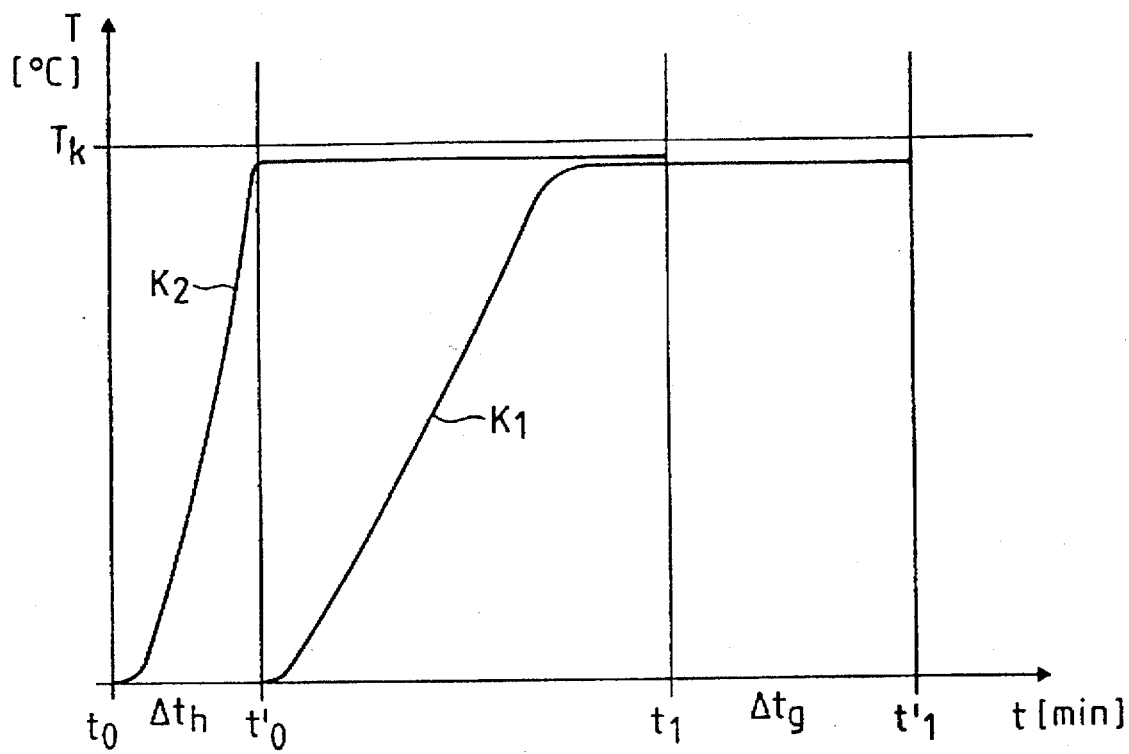
FIG. 5 is a graph with plasma erosion temperature profiles.

FIG. 5 shows a graph of a temperature profile for rapid plasma erosion. The influence of the surface temperature on the erosion rates in the insulating layers is plotted over the erosion time and it is shown that the duration of plasma erosion of the polymer films can be shortened by $\Delta t_g$ by switching in a preheating phase $\Delta t_h$. Two curves $K_1$ and $K_2$ are plotted. Curve $K_1$ gives the surface temperature during plasma erosion without a preheating phase and curve $K_2$ the surface temperature during plasma erosion following a prior preheating phase. The preheating phase $\Delta t_h$ commences at a time $t_o$ and ends at a time $t_o'$ and at this time the surface temperature of curve $K_1$ has risen to just below the harmful critical temperature $T_k$. It is then controlled and kept in advantageous, constant manner close to said critical temperature $T_k$. Plasma erosion starts for both curves $K_1$, $K_2$ at time $t_o'$ and for curve $K_1$ ends at time $t_1$ and for curve $K_2$ at time $t_1'$. FIG. 5 shows that the surface temperature of the not preheated curve $K_1$ rises during plasma erosion and only after approximately ⅓ of the erosion time reaches the critical temperature $T_k$. As a result of the relatively cold surface temperature in the first ⅓ of the plasma erosion, the erosion time is increased compared with the preheated curve $K_2$. The preheating phase $\Delta t_h$ is approximately 10% of a typical plasma erosion time and the time gain $\Delta t_g$ roughly corresponds to the time required by the surface temperature of the not preheated curve $K_1$ to approach the critical temperature $T_k$.

From the process standpoint the preheating phase is brought about by igniting a non-eroding plasma, e.g. nitrogen ($N_2$) or argon (Ar) with a high microwave power. The heat transfer from such a plasma, under similar conditions, is even higher than that from the eroding gas mixture $O_2/CF_4$, so that the preheated curve $K_2$ rises more rapidly towards the limiting temperature $T_k$ than the non-preheated curve $K_1$. For example, when using $N_2$, a flow of 1000 ml/min and a pressure of 0.2 hPa, a power density of 20 Watt/liter is transferred and such a preheating phase $\Delta t_h$ lasts 3 minutes.

Figure 6:
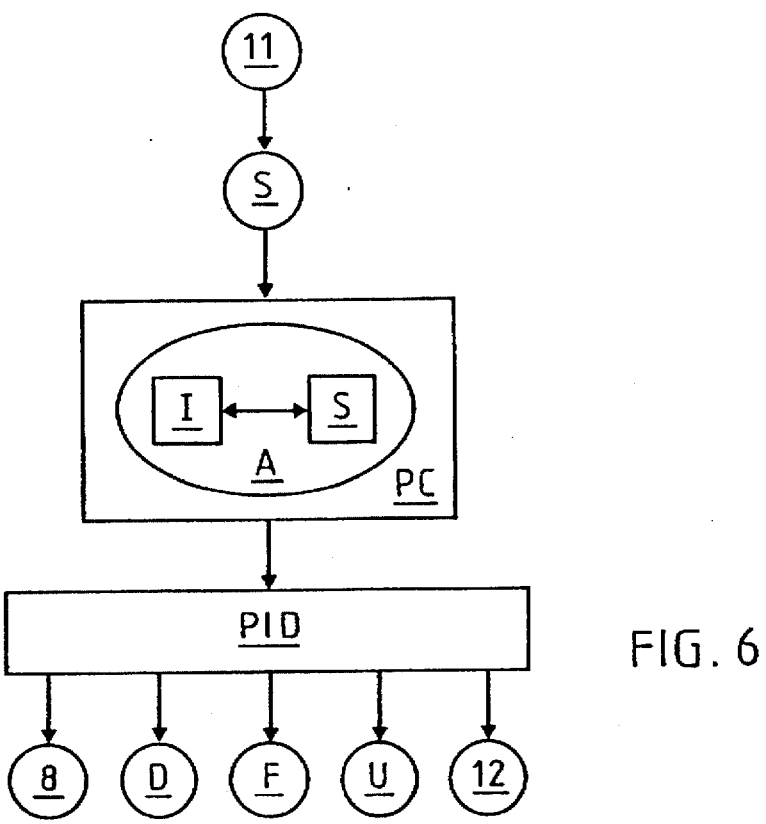
FIG. 6 is a flow chart of the process parameter optimization.

FIG. 6 is a flow chart of the parameter optimization during plasma erosion. According to this flow chart the surface temperature is optimized. The surface temperature of polymer films is continuously measured by means of a pyrometer 11. Said data are processed by means of a signal integrator S, e.g. in a computer PC. They can be represented in graph form or stored on media and can be further processed in a selectable manner. Such integrated data, which e.g. represent the type-specific temperature behavior of a polymer film, e.g. a printed circuit board or film circuit board and reproduce the different thermal capacity of said boards, are controlled by an algorithm A with respect to their time pattern, continuity and relative distance from an upper limiting temperature. Differences between the desired value S and actual values I of the surface temperature and temperature profile can be regulated. This can e.g. take place by the action of a temperature regulator, such as a PID controller PID. If e.g. the temperature rises above the critical limit, then by means of the PID controller the power of the microwave transmitter 8 can be reduced. If e.g. a local heating is measured in the marginal areas (by absorbed microwave radiation), then by means of the PID controller the gas pressure D can be increased. According to FIG. 6 important parameters such as the gas pressure D, gas flow F, power of the microwave transmitter 8, speed U of the rotating loading basket and the heating power of the heater 12 are regulatable (cf. FIG. 4). The plasma reactor can consequently be fully automatically controlled with optimum parameters.

Figure 7:
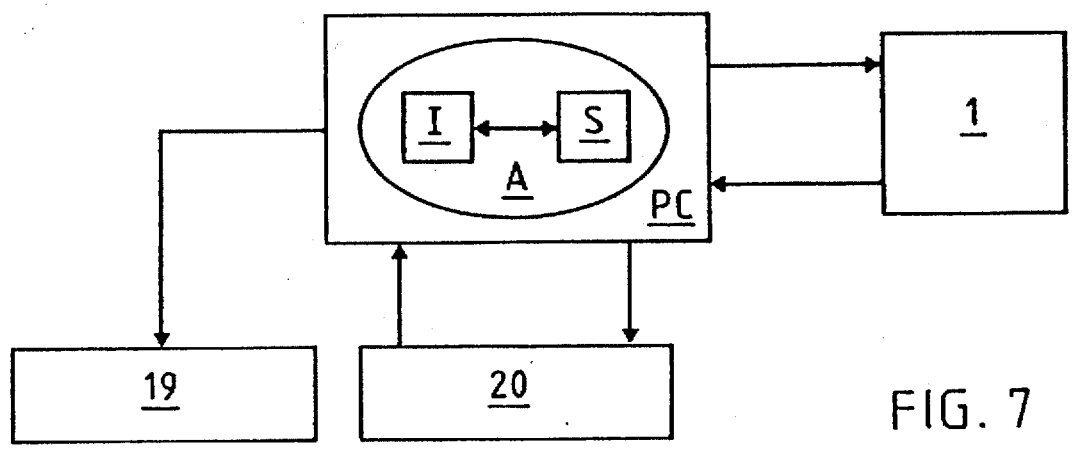
FIG. 7 is a flow chart of the storage and provision of optimized parameter sets for the process.

FIG. 7 is a flow diagram of the storage and provision of optimized parameter sets for plasma erosion. According to this flow diagram for obtaining a maximum erosion rate use is made of interlinked sets of parameters such as excitation frequency, gas pressure, gas flow, residence time, surface temperature, container temperature, erosion time, arrangement and movement of the polymer films as independent sets for different, maximized erosion tasks for plasma erosion control. From the quantity of existing sets the in each case desired set for the erosion task is made available for loading. This flow diagram is consequently an extension of that of FIG. 6. Whereas in the flow diagram of FIG. 6 dependent parameters are monitored and regulated as a function of the surface temperature, in the flow diagram of FIG. 7 there is a monitoring of complete parameters sets. Therefore the plasma reactor can be fully automatically controlled with optimum parameter sets. The data for algorithms A of the computer PC are kept in stock in library form in pockets or magazines 19 and when necessary are loaded into the memory 20, where they are virtually buffer-stored. Each of the selected algorithms A now operates with complete parameter sets with which it controls the plasma reactor 1 as a function of desired values S and actual values I. The algorithm A can operate interactively, i.e. it has the expert knowledge with respect to the plasma reactor, such as e.g. the optimum gas flows and critical temperature limits for materials to be eroded and can communicate with an operator. New parameter sets are stored in the magazine 19.

We claim:

1. A process for structuring polymer film to form microshapes in surface layers of printed and film circuit boards comprising the steps of providing a container for receiving and holding a polymer film for processing, flowing an etching gas mixture into the container, monitoring the surface temperature of the polymer film and the pressure of gas in the chamber, subjecting the gas mixture to microwave energy at a frequency of at least 2.45 GHz and a power density of at least 10 watts per liter of gas to excite the gas mixture into a surface-eroding plasma, providing a heater in the container around the polymer film, and while the polymer film is subjected to surface erosion by the plasma, controlling the power density of the microwave energy, the level of energy provided to the heater and the pressure of gas in the container to maintain the surface of the polymer film at a temperature no greater than 200° C. to thereby form microshapes by eroding selected exposed surface areas of the polymer in a controlled fashion.

2. A process according to claim 1 and including selecting the value of said power density to be sufficiently high to excite the gas mixture to a plasma having a preselected density and sufficiently low to prevent heating the polymer film to a temperature above 200° C. by microwave energy not absorbed by the gas mixture.

3. A process according to claim 1 and including selecting the gas pressure sufficiently high to prevent overheating of the polymer film and sufficiently low to prevent heating the polymer film to a temperature above 200° C. by microwave energy not absorbed by the gas mixture.

4. A process according to claim 1 wherein the polymer film comprises polyimide layers, and wherein the surface erosion is accomplished at a rate greater than 1 μm per minute.

5. A process according to claim 1 and including homogeneously distributing the excited gas mixture to facilitate homogeneous surface temperature distribution of the polymer film.

6. A process according to claim 1 and including forming the heater in a substantially closed manner surrounding the polymer film to minimize emission therefrom and to uniformly heat the container, allowing uniform film surface temperature distribution.

7. A process according to claim 1 and wherein the plasma density and erosion speed are proportional to power density and also proportional to gas pressure, wherein, when a power density and gas pressure are selected to form a plasma density causing a desired erosion rate, the step of controlling the power density and gas pressure includes decreasing power density or gas pressure for each increase of gas pressure or power density to avoid excess heating of the polymer film.

8. A process according to claim 1 wherein the step of flowing an etching gas mixture into the container includes flowing the gases around baffle walls in the container to mix the gas and form a uniform gas flow with homogeneous distribution in the container, and concurrently sucking gases homogeneously from the container through openings in distributor plates.

9. A process according to claim 1 and including supporting the polymer film on a rotating basket to cause homogeneous distribution of gas flow around the polymer film.

10. A process according to claim 9 and including mounting the polymer film on the rotating basket so that gas flow is parallel to the direction of mounting and rotation of the basket, thereby to improve uniform flow of the gas mixture over the polymer film.

11. A process according to claim 1 and including igniting a non-eroding plasma in the container to preheat the surface of the polymer to a temperature below and close to 200 ° C. and thereby reduce the erosion time.

12. A process comprising the steps of providing a container for receiving and holding a polymer film for processing, flowing an etching gas mixture into the container, monitoring the surface temperature of the polymer film using a pyrometer and monitoring the pressure of gas in the chamber, digitizing surface temperature and gas pressure data with a signal integrator and storing the digitized data, subjecting the gas mixture to microwave energy at a frequency of at least 2.45 GHz and a power density of at least 10 watts per liter of gas to excite the gas mixture into a surface-eroding plasma, providing a heater in the container around the polymer film, and while the Polymer film is subjected to surface erosion by the plasma, controlling the power density of the microwave energy, the level of energy provided to the heater and the pressure of gas in the container to maintain the surface of the polymer film at a temperature no treater than 200° C. in accordance with a time pattern algorithm using a computer to thereby erode exposed surface areas of the polymer film in a controlled fashion.

13. A process according to claim 12 wherein the step of controlling includes controlling the polymer film surface temperature and adjusting the power density level of microwave energy in the container.

14. A process according to claim 12 wherein the step of controlling includes controlling the polymer film surface temperature by adjusting the rate of gas flow into the container.

15. A process according to claim 12 wherein the step of controlling includes controlling the polymer film surface temperature by adjusting the level of energy supplied to the heater in the container.

* * * * *